United States Patent
Liu et al.

(10) Patent No.: US 11,152,932 B2
(45) Date of Patent: Oct. 19, 2021

(54) PROTECTION CIRCUIT, OSCILLATION COMPENSATION CIRCUIT AND POWER SUPPLY CIRCUIT IN SOLID STATE PULSE MODULATOR

(71) Applicant: Nuctech Company Limited, Beijing (CN)

(72) Inventors: Yaohong Liu, Beijing (CN); Ziran Zhao, Beijing (CN); Jinsheng Liu, Beijing (CN); Wei Jia, Beijing (CN); Wei Li, Beijing (CN); Xinshui Yan, Beijing (CN)

(73) Assignee: Nuctech Company Limited, Beijing (CN)

( * ) Notice: Subject to any disclaimer, the term of this patent is extended or adjusted under 35 U.S.C. 154(b) by 563 days.

(21) Appl. No.: 16/110,355

(22) Filed: Aug. 23, 2018

(65) Prior Publication Data

US 2019/0089344 A1 Mar. 21, 2019

(30) Foreign Application Priority Data

Sep. 20, 2017 (CN) .......................... 201710858572.7

(51) Int. Cl.
*H03K 17/0812* (2006.01)
*H03K 3/57* (2006.01)
(Continued)

(52) U.S. Cl.
CPC ......... *H03K 17/08128* (2013.01); *H03K 3/57* (2013.01); *H03K 17/06* (2013.01);
(Continued)

(58) Field of Classification Search
CPC ......... H03K 17/0812; H03K 17/08122; H03K 17/08126; H03K 17/08128; H03K 3/57; H03K 17/08116
See application file for complete search history.

(56) References Cited

U.S. PATENT DOCUMENTS

2006/0044025 A1\* 3/2006 Grbovic ........... H03K 17/04123
327/112
2006/0245217 A1\* 11/2006 Kirbie ....................... H03K 3/57
363/60
(Continued)

FOREIGN PATENT DOCUMENTS

EP 2 320 544 A1 5/2011
EP 3 068 051 A1 9/2016
(Continued)

OTHER PUBLICATIONS

CN 201810836997.2 Jul. 26, 2018. (Year: 2018).\*
(Continued)

*Primary Examiner* — Jared Fureman
*Assistant Examiner* — Christopher J Clark
(74) *Attorney, Agent, or Firm* — Knobbe, Martens, Olson & Bear, LLP (57) ABSTRACT

The disclosed technology relates to a gate protection circuit for an Insulated Gate Bipolar Transistor (IGBT), the IGBT being used as a switch device in a solid state pulse modulator based on the MARX generator principle, the gate protection circuit including: a voltage regulator configured to supply a stable voltage to an emitter of the IGBT with respect to the ground for a gate of the IGBT.

19 Claims, 7 Drawing Sheets

(51) Int. Cl.
*H03K 17/081* (2006.01)
*H03K 17/567* (2006.01)
*H03K 17/06* (2006.01)

(52) U.S. Cl.
CPC . *H03K 17/08116* (2013.01); *H03K 17/08126* (2013.01); *H03K 17/567* (2013.01); *H03K 2017/066* (2013.01); *H03K 2217/0081* (2013.01)

(56) References Cited

U.S. PATENT DOCUMENTS

| | | | |
|---|---|---|---|
| 2008/0084642 A1* | 4/2008 | Kato | H03K 17/567 361/56 |
| 2013/0083576 A1* | 4/2013 | Gan | H03K 17/168 363/123 |
| 2015/0076994 A1* | 3/2015 | Rezeanu | H03K 17/00 315/155 |
| 2020/0036379 A1* | 1/2020 | Ying | H03K 17/08128 |

FOREIGN PATENT DOCUMENTS

| | | |
|---|---|---|
| JP | 02-7714 | 1/1990 |
| JP | 06-318678 | 11/1994 |
| JP | 07-111446 | 4/1995 |
| JP | 11-097995 | 4/1999 |
| JP | 3032745 B2 | 4/2000 |
| JP | 2001-119926 | 4/2001 |
| JP | 2002-208847 | 7/2002 |
| JP | 2005-032736 | 2/2005 |
| JP | 2005-287182 A | 10/2005 |
| JP | 2007-088599 A | 4/2007 |
| JP | 2008-154371 | 7/2008 |
| JP | 2009-253484 | 10/2009 |
| JP | 2011-513064 | 4/2011 |
| JP | 2011-229011 | 11/2011 |
| JP | 2012-095409 A | 5/2012 |
| JP | 2013-198185 | 8/2013 |
| JP | 2013-172641 | 9/2013 |
| JP | 2015-507912 | 3/2015 |
| JP | 2015-115976 | 6/2015 |
| KR | 10-1569935 B1 | 11/2015 |
| KR | 2017-0024376 A | 3/2017 |
| WO | WO 2017/095635 | 6/2017 |
| WO | WO 2017/095635 A1 | 6/2017 |

OTHER PUBLICATIONS

Second Office Action Issued in Japanese Application No. 2018-152248, dated Dec. 2, 2019 which corresponds in priority to above-identified subject U.S. Application.

Office Action Issued for Korean Application No. 10-2018-0095406 dated May 31, 2019, which corresponds in priority to above-identified subject U.S. Application.

Extended European Search Report for European Application No. 18190829.4 dated May 29, 2019, which corresponds in priority to above-identified subject U.S. Application.

Office Action Issued in Australian Application No. 2018220119, dated Aug. 26, 2019, which corresponds in priority to above-identified subject U.S. Application.

Office Action Issued in Japanese Application No. 2018-152248, dated Jul. 29, 2019 which corresponds in priority to above-identified subject U.S. Application.

* cited by examiner

PROTECTION CIRCUIT, OSCILLATION COMPENSATION CIRCUIT AND POWER SUPPLY CIRCUIT IN SOLID STATE PULSE MODULATOR

CROSS-REFERENCE TO RELATED APPLICATIONS

This application claims priority to Chinese Patent App. 201710858572.7, filed on Sep. 20, 2017, which is incorporated by reference herein in its entirety.

BACKGROUND OF THE DISCLOSED TECHNOLOGY

Field of the Technology

The disclosed technology generally relates to the field of electronic technology, and more particularly, to a gate protection circuit, an oscillation compensation circuit, an overcurrent protection circuit, and an overvoltage protection circuit for an Insulated Gate Bipolar Transistor (IGBT), a power supply circuit for a solid state pulse modulator based on the MARX generator principle, and a solid state pulse modulator based on the MARX generator principle including one or more of the above circuits.

Description of the Related Technology

A solid state pulse modulator based on the MARX generator principle can use an Insulated-gate Bipolar Transistor (IGBT) as a switch element, and turn-on and turn-off of the IGBT is controlled by a gate voltage. The IGBT is turned on when a positive voltage is applied to a gate of the IGBT, and the IGBT is turned off when a negative voltage is applied to the gate.

The reliability of the IGBT is very important for the solid state pulse modulator. The safety and reliability of the IGBT is determined, at least in part, by a voltage between the gate and an emitter of the IGBT, a voltage between a collector and the emitter of the IGBT, current flowing through the collector-emitter of the IGBT, and a junction temperature of the IGBT, etc.

On the one hand, if the voltage between the gate and the emitter of the IGBT, that is, a driving voltage is too low, the IGBT cannot operate stably and normally. On the other hand, if the voltage is too high to exceed a withstand voltage between the gate and the emitter, the IGBT may be permanently damaged. Similarly, if the voltage applied between the collector and the emitter of the IGBT exceeds the withstand voltage between the collector and the emitter, or the current flowing through the collector-emitter of the IGBT exceeds maximum allowed current between the collector and the emitter, or the junction temperature of the IGBT exceeds an allowable value of its junction temperature, the IGBT may be permanently damaged.

Therefore, problems with reliability of various stages of IGBT switches exist with respect to the above-described solid state pulse modulator.

SUMMARY OF CERTAIN INVENTIVE ASPECTS

The disclosed technology aims to improve upon solid state pulse modulators, for example to ensure that solid state pulse modulators operate stably and reliably. The disclosed technology may, at least partially, solve one or more example problems comprising gate protection, oscillation compensation, overcurrent protection or overvoltage protection etc. of various stages of IGBT switches in a solid state pulse modulator based on the MARX generator principle.

According to an aspect of the disclosed technology, there is provided a solid state pulse modulator based on the MARX generator principle, comprising a gate protection circuit for an Insulated Gate Bipolar Transistor (IGBT), the IGBT being used as a switch device in a solid state pulse modulator based on the MARX generator principle, the gate protection circuit comprising:

a voltage regulator configured to supply a stable voltage to an emitter of the IGBT with respect to the ground for a gate of the IGBT.

According to an aspect of the disclosed technology, the voltage regulator is a voltage regulation diode having a cathode connected to an emitter of the IGBT, and an anode connected to the ground for the gate of the IGBT.

According to an aspect of the disclosed technology, the solid state pulse modulator further comprises:

a resistor connected between the gate and the emitter of the IGBT.

According to an aspect of the disclosed technology, the solid state pulse modulator further comprises:

a bidirectional transient voltage suppression TVS diode connected between the gate and the emitter of the IGBT.

According to an aspect of the disclosed technology, a stable voltage of 15V is provided across the TVS diode.

According to an aspect of the disclosed technology, the solid state pulse modulator further comprises an oscillation compensation circuit for the IGBT, the oscillation compensation circuit comprising:

an oscillation suppression resistor $R_G$, wherein a driving signal of the IGBT is input to a gate of the IGBT via the oscillation suppression resistor; and an oscillation suppression capacitor $C_G$ connected between the gate and an emitter of the IGBT.

According to an aspect of the disclosed technology, the oscillation suppression resistor $R_G$ and the oscillation suppression capacitor $C_G$ satisfy the following formula:

$$R_G = 2\sqrt{\frac{L_G}{C_G}}$$

where $L_G$ is distributed inductance in a driving circuit of the IGBT.

According to an aspect of the disclosed technology, the solid state pulse modulator further comprises an overcurrent protection circuit for the IGBT, the overcurrent protection circuit comprising:

a collector voltage detection circuit configured to detect a voltage at a collector of the IGBT during a turn-on phase of the IGBT, and output a signal indicating whether the voltage at the collector exceeds a reference value; and an overcurrent trigger circuit configured to output an overcurrent trigger signal to the driving circuit of the IGBT when the signal output by the collector voltage detection circuit indicates that the voltage at the collector exceeds the reference value, so that the driving circuit outputs to the gate of the IGBT a driving signal which causes the IGBT to be turned off.

According to an aspect of the disclosed technology, the overcurrent trigger signal is input to the driving circuit through an AND gate together with a gate control trigger signal of the IGBT, and wherein, when the signal output by the collector voltage detection circuit indicates that the voltage at the collector exceeds the reference value, the overcurrent trigger circuit outputs the overcurrent trigger signal at a low level.

According to an aspect of the disclosed technology, the overcurrent trigger circuit comprises a transistor having a first terminal connected to an input terminal of the AND gate, and a second terminal connected to a low level, and wherein, in response to the signal output by the collector voltage detection circuit indicating that the voltage at the collector exceeds the reference value, the transistor is turned on to turn on a connection between the first terminal and the second terminal.

According to an aspect of the disclosed technology, the collector voltage detection circuit is configured to detect the voltage at the collector for a predetermined time after a time at which the IGBT starts to be turned on.

According to an aspect of the disclosed technology, the collector voltage detection circuit comprises:

a constant current source configured to start up in response to the driving signal in the driving circuit which causes the IGBT to be turned on, to generate constant detection current; and a delay mechanism configured to cause the constant detection current generated by the constant current source to be supplied to the collector of the IGBT when a predetermined time elapses after the constant current source starts up.

According to an aspect of the disclosed technology, the delay mechanism comprises a capacitor, wherein an output terminal of the constant current source is connected on the one hand to a first terminal of the capacitor and on the other hand to the collector of the IGBT via a detection resistor, wherein a second terminal of the capacitor is connected to a ground potential, and wherein there is a unidirectional conduction device between the constant current source and the collector, so that the capacitor can only be charged by the current from the constant current source.

According to an aspect of the disclosed technology, the collector voltage detection circuit further comprises: a voltage regulation diode and a resistor connected between the first terminal of the capacitor and the ground potential, and wherein a connection node between the voltage regulation diode and the resistor is used as an output node of the collector voltage detection circuit.

According to an aspect of the disclosed technology, the solid state pulse modulator further comprises an overvoltage protection circuit for the IGBT, the overvoltage protection circuit comprising:

a collector voltage detection circuit configured to detect a voltage at a collector of the IGBT during a turn-off phase of the IGBT, and output a signal indicating whether the voltage at the collector exceeds a reference value; and an overvoltage trigger circuit configured to output an overvoltage trigger signal to a driving circuit of the IGBT when the signal output by the collector voltage detection circuit indicates that the voltage at the collector exceeds the reference value, so that the driving circuit outputs to a gate of the IGBT a driving signal which causes the IGBT to be turned on.

According to an aspect of the disclosed technology, the collector voltage detection circuit comprises one or more transient voltage suppression TVS diodes connected in series.

According to an aspect of the disclosed technology, an output terminal of the overvoltage trigger circuit is connected to a control terminal of a high side transistor of a driving current amplifier circuit in push-pull configuration in the driving circuit of the IGBT.

According to an aspect of the disclosed technology, the solid state pulse modulator further comprises an additional overvoltage protection branch configured to output to the gate of the IGBT a signal for causing the IGBT to be turned on when the signal output by the collector voltage detection circuit indicates that the voltage at the collector exceeds the reference value.

According to an aspect of the disclosed technology, the solid state pulse modulator further comprises a power supply circuit for a driving circuit of the IGBT, comprising:

a mutual inductance coil;

a conductive wire coupled to the mutual inductance coil, and configured to transmit alternating current and thus generate an alternating current signal in the mutual inductance coil;

a rectifier configured to convert the alternating current signal into a direct current signal to supply power to the driving circuit, wherein a positive output terminal of the rectifier provides a power supply voltage, and a negative output terminal of the rectifier is connected to a ground for a gate of the IGBT; and a voltage regulation diode connected between the positive output terminal and the negative output terminal of the rectifier.

According to an aspect of the disclosed technology, the conductive wire passes through the mutual inductance coil.

BRIEF DESCRIPTION OF THE DRAWINGS

For a more complete understanding of the disclosed technology and its advantages, reference will now be made to the following description in conjunction with the drawings, in which.

DETAILED DESCRIPTION OF CERTAIN ILLUSTRATIVE EMBODIMENTS

Other aspects, advantages, and salient features of the disclosed technology will become apparent to those skilled in the art according to the following detailed description of the exemplary embodiments of the disclosed technology with reference to the drawings.

In the disclosed technology, the terms "comprising" and "including" and their derivatives are meant to be inclusive and not limiting, and the term "or" is inclusive, meaning "and/or."

In the present specification, the following various embodiments for describing the principles of the disclosed technology are merely illustrative, and should not be construed as limiting the scope of the disclosed technology in any way. The following description with reference to the accompanying drawings is used to facilitate the complete understanding of exemplary embodiments of the disclosed technology defined by the claims and their equivalents, but these details are considered to be merely exemplary. Accordingly, it will be appreciated by those skilled in the art that various changes and modifications may be made to the embodiments described herein without departing from the scope and spirit of the disclosed technology. In addition, descriptions of well-known functions and constructions are omitted for clarity and conciseness. In addition, the same reference numerals are used throughout the drawings for similar functions and operations.

Figure 1:
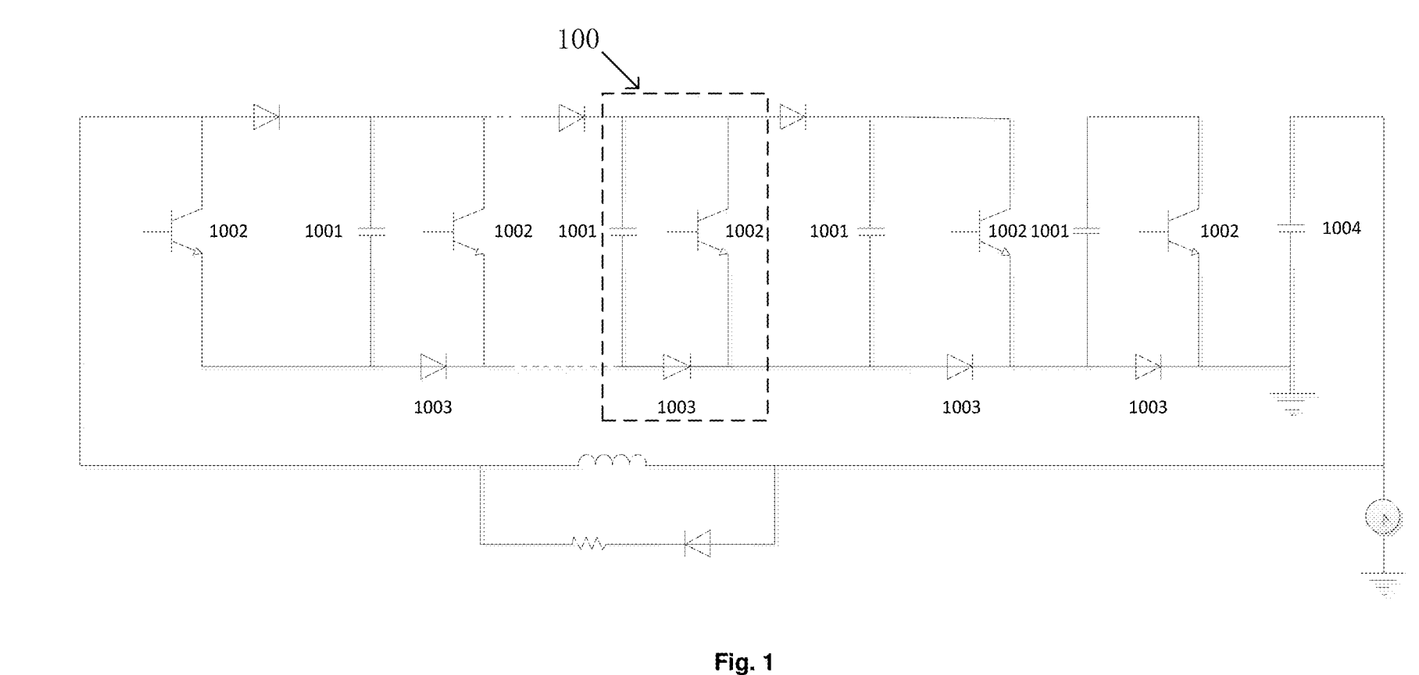
FIG. 1 illustrates a schematic circuit diagram of a solid state pulse modulator according to an embodiment of the disclosed technology.

FIG. 1 illustrates a schematic circuit diagram of a solid state pulse modulator according to an embodiment of the disclosed technology.

As shown in FIG. 1, the solid state pulse modulator according to this embodiment may comprise a plurality of (for example, 11, depending on pulse voltages required) charging and discharging modules 100. Each of the charging and discharging modules 100 may comprise a capacitor 1001, an IGBT 1002 and diode 1003. In each of the charging and discharging modules 100, a first terminal of the capacitor 1001 is connected to a collector of the IGBT, and a second terminal of the capacitor 1001 is connected to an emitter of the IGBT via the diode 1003. In addition, a gate of the IGBT may be connected to a driving circuit to be turned on or turned off according to a driving signal from the driving circuit, and accordingly a connection configuration of the capacitors in various charging and discharging modules 100 is changed accordingly. The plurality of charging and discharging modules 100 are connected in parallel via diodes. A first charging and discharging module 100 is connected to a capacitor 1004, and a last charging and discharging module 100 is connected in parallel with another IGBT 1002 via a diode.

Referring to FIG. 1, all IGBTs are turned off in a charging process, so that all capacitors are connected in parallel, and a voltage across each capacitor may be a power supply voltage for charging (e.g., 750V). All IGBTs may be turned on in a discharging process, so that various capacitors are connected in series via the IGBTs, and thus the voltages across the capacitors may be added to provide a high voltage to the outside.

For IGBTs in such a circuit configuration, a variety of protection measures may be designed.

Figure 2:
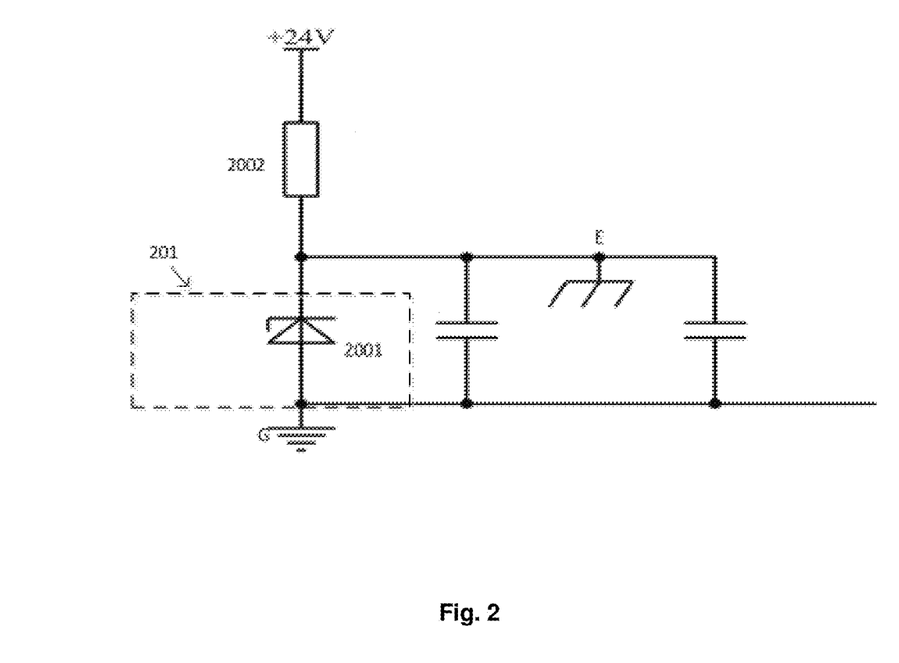
FIG. 2 illustrates a schematic circuit diagram of a gate protection circuit for an IGBT according to an embodiment of the disclosed technology.

FIG. 2 illustrates a schematic circuit diagram of a gate protection circuit for an IGBT according to an embodiment of the disclosed technology.

As shown in FIG. 2, the gate protection circuit according to this embodiment comprises a voltage regulator 201 which may supply a stable voltage to an emitter E of the IGBT with respect to the ground for a gate G of the IGBT. For example, the voltage regulator may be a voltage regulation diode 2001. As shown by a dashed box in FIG. 2, a cathode of the voltage regulation diode 2001 is connected to the emitter E of the IGBT, and an anode of the voltage regulation diode is connected to the ground for the gate G of the IGBT. Additionally, the voltage regulation diode 2001 is connected in reverse between a positive power supply and the ground for the gate (e.g., via a resistor 2002). Thus, the gate of the IGBT is grounded during a period in which the IGBT needs to be turned off. Therefore, the voltage regulation diode 2001 is reversely broken down, and thus a constant voltage such as 5V is maintained between the emitter and the gate (at this time, a ground potential). Thus, when the IGBT is turned off, the voltage between the gate and the emitter may be set to a stable negative voltage (for example, -5V). This negative bias can prevent the IGBT from being mis-turned on due to excessive surge current when the IGBT is turned off.

Turn-on resistance of the IGBT decreases when a forward driving voltage increases, to reduce a turn-on loss. However, if the forward driving voltage is too large, the gate may easily be damaged. Therefore it may be necessary to appropriately select the forward driving voltage of the voltage regulation diode 2001, for example, 15V. In addition, after the IGBT is turned on, the driving circuit should provide sufficient voltage and current amplitude to prevent the IGBT from being damaged due to being out of a saturation turn-on region under normal operation and overload conditions.

Figure 3:
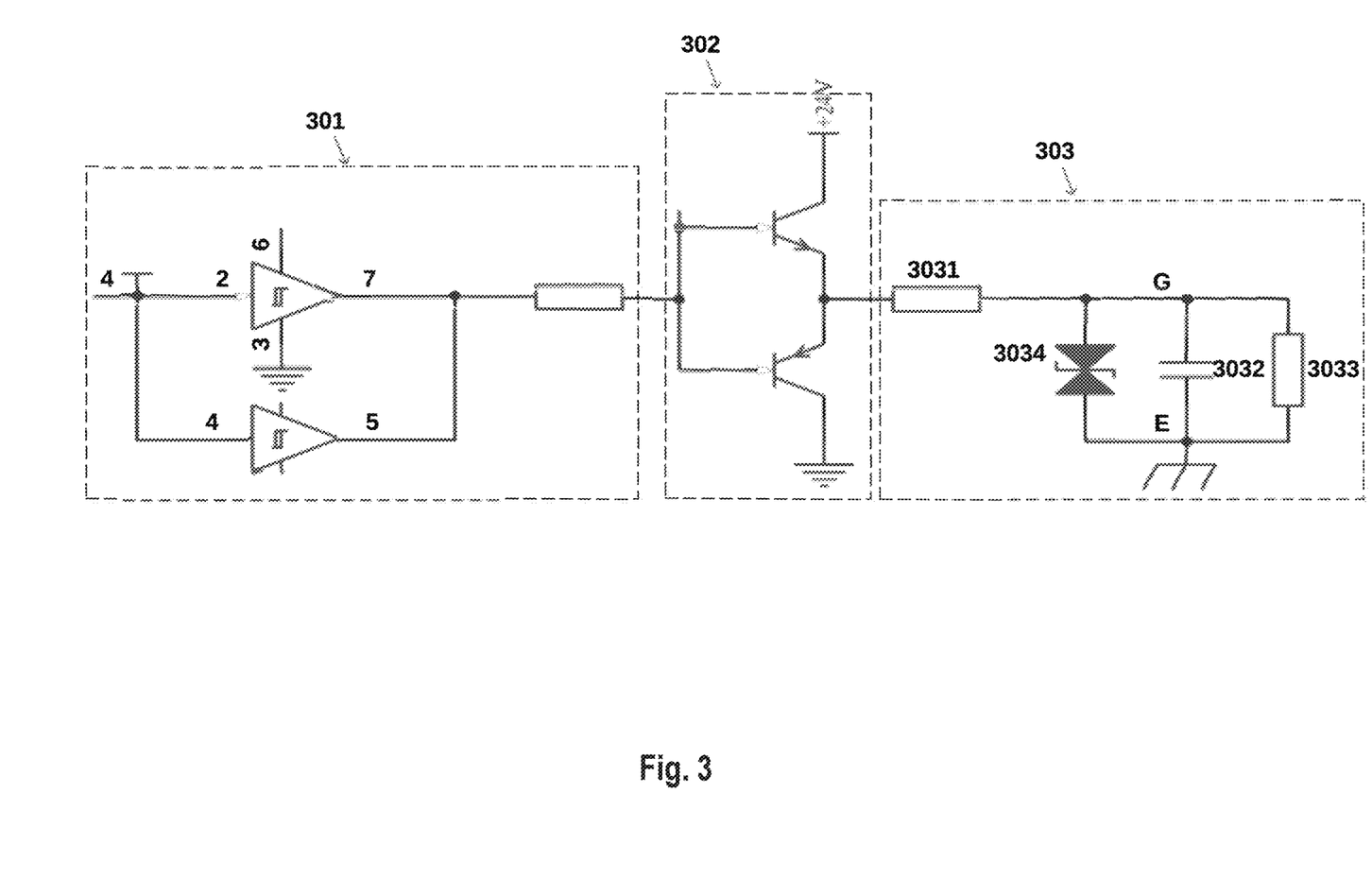
FIG. 3 illustrates a schematic circuit diagram of an oscillation compensation circuit for an IGBT according to an embodiment of the disclosed technology.

The voltage between the gate and the emitter of the IGBT is easily disturbed by parasitic parameters of the IGBT and the circuit, when the IGBT is turned off, and therefore the voltage between the gate and the emitter of the IGBT causes the device to be mis-turned on. In order to prevent occurrence of this phenomenon, the gate protection circuit may further comprise a resistor 3033 connected between the gate G and the emitter E, as shown in FIG. 3. In addition, in practical applications, in order to prevent occurrence of high voltage spikes in the gate driving circuit, the gate protection circuit may further comprise a TVS diode 3034 connected between the gate G and the emitter E, as shown in FIG. 3. As mentioned above, a stable voltage of 15V may be provided across the TVS diode 3034.

In another embodiment, as is known, fast turn-on and turn-off of the IGBT facilitates reducing switching losses. Since the solid state modulator has a short pulse width (e.g. a few μs), in the solid state modulator, turn-on and turn-off (e.g., switching time) of the IGBT should occur rapidly. Junction capacitance of the gate of the IGBT is usually large, and large driving current may be required in order to achieve fast turn-on and turn-off.

In one example, the driving circuit of the IGBT (shown by the dashed box in FIG. 3) may comprise a driving signal generator 301 and an amplification stage 302. The driving signal generator 301 may generate a driving signal (driving pulse) for the IGBT according to a received gate control trigger signal (input at a terminal 4). For example, the driving signal generator 301 may comprise a dedicated trigger chip IXDN 604 (reference numerals 2, 3, 4, 5, 6, 7 in FIG. 3 indicate respective pins of the IXDN 604). The amplification stage 302 may amplify the driving signal (e.g., amplify current to achieve large driving current). In one example, the amplification stage 302 may comprise an amplification device such as a triode in a push-pull configuration. On the other hand, the triode may also facilitate the access of an overvoltage protection circuit described below. The driving current of the driving circuit may be large, and internal resistance of the driving circuit may be less than 1 ohm.

Due to the fast triggering speed of the IGBT, distributed inductance and the gate capacitance in the driving circuit form high frequency oscillation. According to an embodiment of the disclosed technology, an oscillation compensation circuit 303 may be provided to at least partially suppress such oscillation.

FIG. 3 illustrates a schematic circuit diagram of an oscillation compensation circuit for an IGBT according to an embodiment of the disclosed technology.

As shown in FIG. 3, the oscillation compensation circuit 303 according to this embodiment may comprise an oscillation suppression resistor 3031 connected in series to a gate of the IGBT and an oscillation suppression capacitor 3032 connected in parallel between the gate and an emitter E of the IGBT. A driving signal of the IGBT is input to the gate G of the IGBT via the oscillation suppression resistor 3031, and the oscillation suppression capacitor 3032 is connected between the gate G and the emitter E of the IGBT. Selecting appropriate oscillation suppression resistor 3031 and oscillation suppression capacitor 3032 is advantageous for suppressing oscillation without increasing switching time and switching loss of the IGBT. For example, the oscillation suppression resistor 3031 and the oscillation suppression capacitor 3032 may satisfy the following formula (1):

$$R_G = 2\sqrt{\frac{L_G}{C_G}} \qquad \text{Formula (1)}$$

where $R_G$ is a resistance value of the oscillation suppression resistor 3031, $C_G$ is a capacitance value of the suppression oscillation capacitor 3032, and $L_G$ is distributed inductance of the driving circuit for the IGBT.

In one example, junction capacitance of the IGBT used in the solid state modulator is about tens of nF, the distributed inductance in the driving circuit is about tens of nH, and other internal resistance in the driving circuit is about 1 ohm. In this case, for example, $R_G$ may be selected as 1 ohm, $C_G$ may be selected as 47 nF, and at this time a trigger rising edge is about several hundreds of ns.

In another embodiment, since a load of the solid state modulator is a magnetron, and ignition of the magnetron is unavoidable, an overcurrent problem of the IGBT must be considered. Generally, the overcurrent protection circuit of the IGBT adopts a soft turn-off scheme, since the fast turn-off of the gate voltage may cause the IGBT to be "locked" and cannot be turned off when severe overcurrent of the IGBT happens. The gate voltage may require a reduction process to form slow turn-off (e.g., tens of μs). However, in a solid state modulator, hard turn-off may be used. This is because in the solid state modulator, an actual turn-on pulse width of the IGBT is very narrow, turn-on operation current of the IGBT is large, and rated current of the selected IGBT is also large. Even in a short-circuit state such as ignition of the magnetron, the short-circuit current may have a rise process for more than ten μs due to limitation of the distributed inductance in the loop. If the overcurrent fault can be determined in time, turn-off is enabled as soon as possible, and the short-circuit current can be reduced.

Figure 4A:
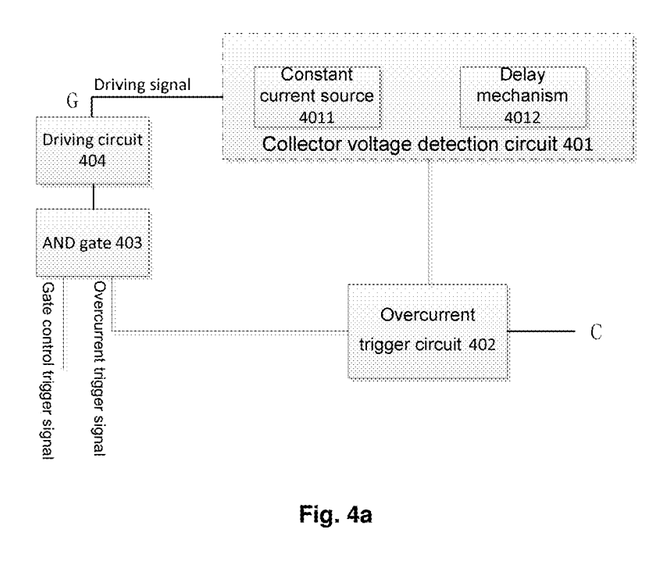
FIG. 4a illustrates a schematic structural diagram of an overcurrent protection circuit for an IGBT according to an embodiment of the disclosed technology.

A turn-on voltage drop of the IGBT is very low when the IGBT is normally turned on, and the turn-on voltage drop increases when overcurrent of the IGBT happens. Therefore, the turn-on voltage drop may be detected in the turn-on process, and it may be determined whether overcurrent of the IGBT happens. FIG. 4a illustrates a schematic structural diagram of an overcurrent protection circuit for an IGBT according to an embodiment of the disclosed technology.

As shown in FIG. 4a, the overcurrent protection circuit according to this embodiment may comprise a collector voltage detection circuit 401 and an overcurrent trigger circuit 402.

The collector voltage detection circuit 401 may detect a voltage at a collector of the IGBT during a turn-on phase of the IGBT, and output a signal indicating whether the voltage at the collector exceeds a reference value. According to an embodiment of the disclosed technology, the detection of the voltage at the collector by the collector voltage detection circuit 401 may be started after a period of time (for example, 1 to 2 μs) after the IGBT is turned on (e.g., because the voltage drop may be relatively large when the IGBT is just turned on). It is easy to cause the collector voltage detection circuit 401 to detect a high voltage and thus cause malfunction of the overcurrent protection circuit.

The overcurrent trigger circuit 402 may output an overcurrent trigger signal to the driving circuit of the IGBT when a signal output by the collector voltage detection circuit indicates that the voltage at the collector exceeds the reference value, so that the driving circuit outputs to the gate of the IGBT a driving signal which causes the IGBT to be turned off.

Figure 4B:
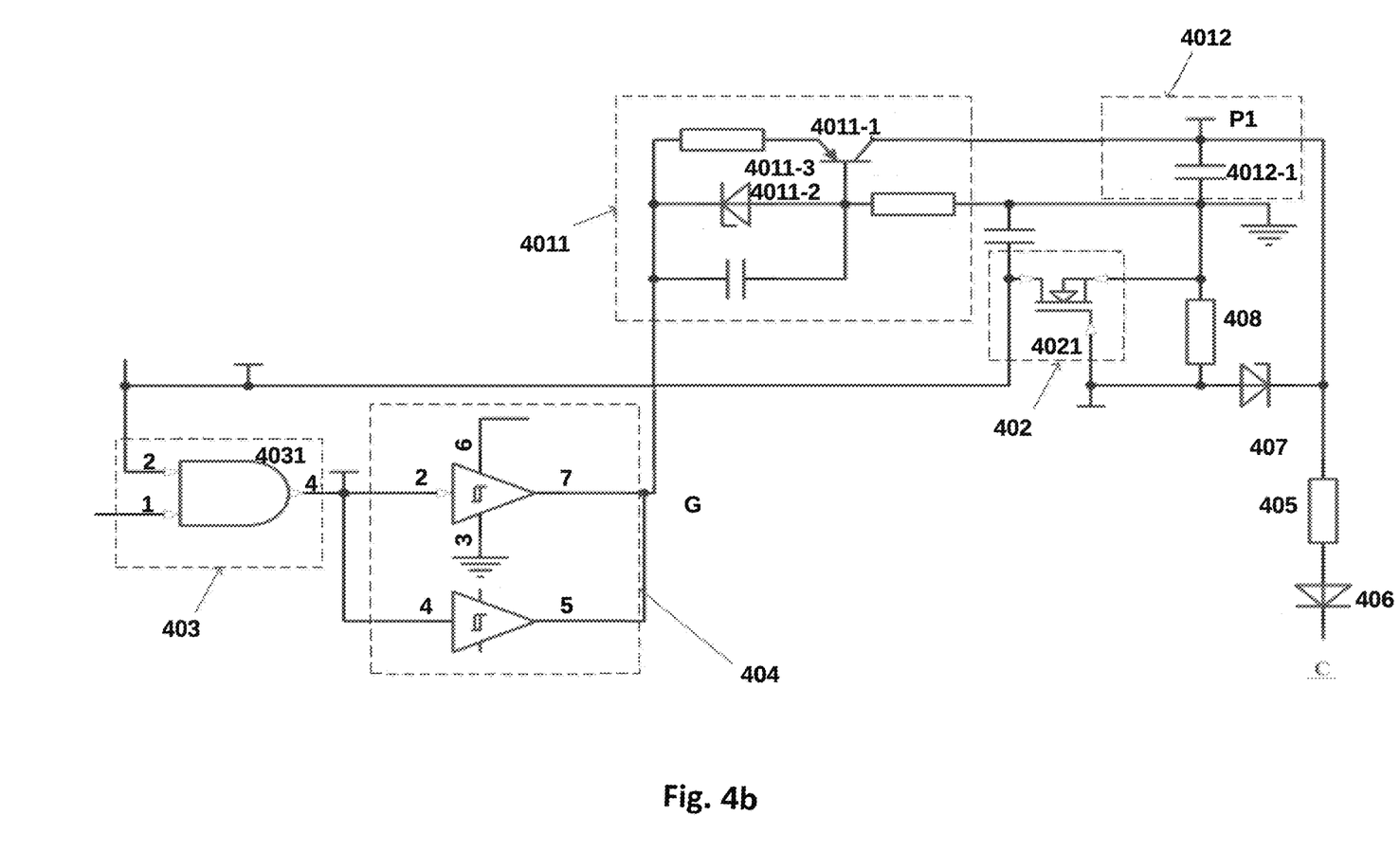
FIG. 4b illustrates a schematic structural diagram of an overcurrent protection circuit for an IGBT according to an embodiment of the disclosed technology.

Thus, the driving circuit may receive two control signals, wherein one of the control signals is a gate control trigger signal which normally controls the IGBT to be turned on/off, and the other of the control signals is the above-described overcurrent trigger signal. In one example, the overcurrent trigger signal may be input to the driving circuit 404 via an AND gate 403 along with the gate control trigger signal of the IGBT. For example, as shown in FIG. 4b, the overcurrent trigger signal is input to a terminal 2 of an AND gate 4031, and the gate control trigger signal is input to a terminal 1 of the AND gate 4031.

The overcurrent trigger circuit may output an overcurrent trigger signal at a low level when the signal output by the collector voltage detection circuit 401 indicates that the voltage at the collector exceeds the reference value. Due to the action of the AND gate, even if the gate control trigger signal is high (used to drive the IGBT to be turned on), the input of the driving signal is set to be low, thereby turning off the voltage at the gate G. Thus, the current path is disconnected, thereby achieving overcurrent protection.

In one example, the overcurrent trigger circuit 402 may selectively output a low level signal according to an output of the collector voltage detection circuit 401. For example, the overcurrent trigger circuit 402 may comprise a switch device such as a field effect transistor 4021, which has a gate controlled by the output of the collector voltage detection circuit 401 to selectively connect the terminal 2 of the AND gate 4031 to the ground. For example, as shown in FIG. 4b, a first terminal of the transistor 4021 is connected to an input terminal of the AND gate 403. For example, the terminal 2 of the AND gate 4031, and a second terminal of the transistor 4021 is connected to a low level. In response to the signal output by the collector voltage detection circuit 401 indicating that the voltage at the collector exceeds a reference value (e.g., a high level applied to the gate of the field effect transistor 4021), the transistor 4021 is turned on, to turn on a connection between the first terminal and the second terminal, and thus connecting the first terminal (e.g., the input terminal of the AND gate 4031) to the ground.

There are various voltage detection techniques in the art. According to an embodiment of the disclosed technology, detection current may be supplied to the collector (e.g. via a resistor) to perform voltage detection. For example, the collector voltage detection circuit 401 may comprise a constant current source 4011.

The constant current source 4011 may start up (e.g., starting up in synchronization with the turn-on of the IGBT) in response to a driving signal in the driving circuit 404 which causes the IGBT to be turned on to generate constant detection current. In one example, the constant current source 4011 may comprise a transistor 4011-1. A voltage regulation diode 4011-2 and a resistor 4011-3 are connected between a gate and a drain of the transistor. When the driving signal is high (indicating that the IGBT is turned on), the voltage regulation diode 4011-2 may be reversely broken down and thus a constant voltage is maintained across the voltage regulation diode 4011-2. This constant voltage produces constant emitter current via the resistor 4011-3, and thus substantially constant current may be output by the collector for use as the detection current. Of course, the configuration of the constant current source is not limited thereto.

As described above, the detection current needs to be supplied to the collector after a period of time after the IGBT is turned on to avoid malfunction, and therefore, the collector voltage detection circuit 401 according to this embodiment may further comprise a delay mechanism 4012. The delay mechanism 4012 causes the constant current generated by the constant current source 4011 to be supplied to the collector C of the IGBT when a predetermined time elapses after the constant current source starts up.

In one example, the delay mechanism 4012 may comprise a capacitor, such as capacitor 4012-1 shown in FIG. 4b. For example, an output terminal of the constant current source 4011 is connected to a first terminal of the capacitor on the one hand and to the collector C of the IGBT via a detection resistor 405 on the other hand. A second terminal of the capacitor 4012-1 may be connected to the ground potential. There is a unidirectional conduction device such as a diode 406 between the constant current source 4011 and the collector C, so that the capacitor can only be charged by the current from the constant current source (thereby, for example, preventing the collector C from charging the capacitor 4012-1 when there is a high voltage at the collector C).

It is assumed that there is no charge in the capacitor 4012-1 in an initial state of the circuit, and therefore a voltage at the first terminal thereof (a voltage at a node P1) is approximately zero. At the moment when the IGBT is turned on, the constant current source starts up, and thus constant detection current is generated. Since the voltage at P1 is low at this time (the diode 406 is reversely biased), the detection current mainly charges the capacitor 4012-1. In addition, the voltage which is low at the node P1 does not cause the voltage regulation diode 407 to be reversely broken down, thus the gate of the transistor 4021 is connected to the ground via a resistor 408, and therefore the transistor 4021 is turned off, so that the input at the terminal 2 of the AND gate 4031 is high. In this case, the generation of the driving signal depends on the gate control trigger signal.

As the detection current charges the capacitor 4012-1, the voltage at P1 gradually increases. In a case of normal operation, when a period of time elapses after the IGBT is turned on, the voltage at the collector decreases (close to the voltage at the emitter). When the voltage at P1 increases to be above the voltage at the collector, the detection current may flow into the collector C. That is, the detection current is delayed by the time required for the voltage at P1 to increase to be above the voltage at the collector. At this time, the voltage at P1 is approximately the voltage at the collector+the detection current *R1, where R1 represents a resistance value of the resistor 405. A current value of the detection current, a resistance value of the resistor 405, and parameters of the voltage regulation diode 407 may be selected so that the voltage regulation diode 407 is not reversely broken down at this time, and thus the input at the terminal 2 of the AND gate 4031 is maintained at a high level.

In a case of overcurrent, the voltage at the collector may increase. Due to the presence of the unidirectional conduction device 406, the detection current may further charge the capacitor 4012-1 and thus the voltage at P1 increases. Finally, the voltage at P1 may cause the voltage regulation diode 407 to be reversely broken down and thus a constant voltage is maintained across the voltage regulation diode 407. The presence of this voltage may cause the transistor 4021 to be turned on, and thus pull down the input at the terminal 2 of the AND gate 4031 to the ground potential. In response to this low input, the driving circuit may cause the IGBT to be turned off.

In this example, the collector voltage detection circuit 401 converts a high voltage and a low voltage at the collector to a high level signal and a low level signal by the voltage regulation diode 407 and the resistor 408 connected between the first terminal of the capacitor 4012-1 and the ground potential. The high level signal and the low level signal are output at a connection node between the voltage regulation diode 407 and the resistor 408 to control the overcurrent trigger circuit 402. However, the disclosed technology is not limited thereto. There are various techniques in the art to convert the high voltage and low voltage at P1 into corresponding high and low level control signals, respectively.

In another embodiment, the IGBT in the solid state modulator needs to be turned off quickly, and a high surge spike voltage $U_{CE}$ may be generated between the collector C and the emitter E of the IGBT due to the action of stray inductance and load inductance in the circuit. In addition, the overvoltage resistance of the IGBT is poor, which may cause the IGBT to be broken down. Therefore, overvoltage protection of the IGBT is also very important. A method of reducing the voltage $U_{CE}$ between the collector and the emitter of the IGBT may be to increase resistance $R_G$ of the gate. However, the increase of $R_G$ may slow down the turn-on/off speed of the IGBT, thereby increasing the turn-on/off loss. Accordingly, this method is not ideal.

Figure 5A:
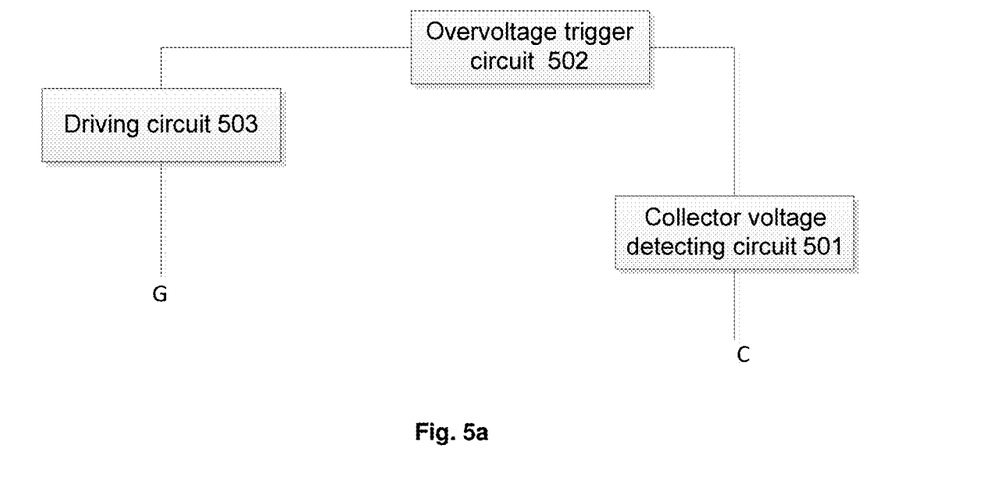
FIG. 5a illustrates a schematic structural diagram of an overvoltage protection circuit for an IGBT according to an embodiment of the disclosed technology.

FIG. 5a illustrates an overvoltage protection circuit for an IGBT according to an embodiment of the disclosed technology.

As shown in FIG. 5a, the overvoltage protection circuit according to this embodiment may comprise a collector voltage detection circuit 501 and an overvoltage trigger circuit 502.

Figure 5B:
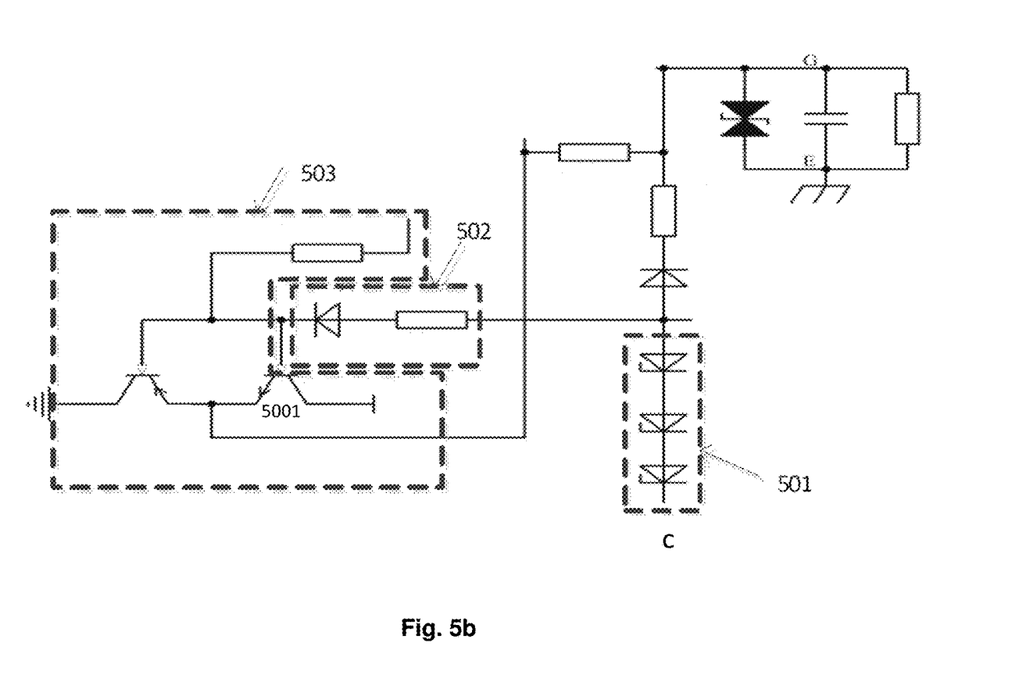
FIG. 5b illustrates a schematic structural diagram of an overvoltage protection circuit for an IGBT according to an embodiment of the disclosed technology.

The collector voltage detection circuit 501 may detect a voltage at a collector of the IGBT during a turn-off phase of the IGBT, and output a signal indicating whether the voltage at the collector exceeds a reference value. The reference value may be, for example, 750V depending on actual needs. For example, the collector voltage detection circuit 501 may comprise one or more TVS diodes connected in series, as shown in FIG. 5b. A number of the TVS diodes may be determined according to the above reference value, for example, the number of the TVS diodes is 3 in a case that the reference value is 750V. In this case, during the turn-off phase of the IGBT, when the voltage at the collector is too high (surge voltage), the collector voltage detection circuit 501 may output a high level signal.

The overvoltage trigger circuit 502 may output an overvoltage trigger signal to a driving circuit 503 of the IGBT when the signal output by the collector voltage detection circuit 501 indicates that the voltage at the collector exceeds the reference value, so that the driving circuit 503 outputs to a gate of the IGBT a driving signal which causes the IGBT to be turned on.

In one example, an output terminal of the overvoltage trigger circuit 502 may be connected to a control terminal of a high side transistor (e.g., 5001, as shown in FIG. 5b) of a driving current amplifier circuit in push-pull configuration in the driving circuit 503 of the IGBT. In this case, in a case of determining the overvoltage (that is, the output signal of the collector voltage detection circuit 501 indicates that the voltage at the collector exceeds the reference value), the overvoltage trigger circuit 502 may output a high level signal to cause the high side transistor to be turned on, and thus output to the gate of the IGBT a driving signal for driving the IGBT to be turned on. As shown in FIG. 5b, when the collector voltage detection circuit 501 indicates that the voltage at the collector is too high using a high level signal, the overvoltage trigger circuit 502 may simply connect an output node of the collector voltage detection circuit 501 (e.g., via a resistor) to a gate of the high side transistor.

Thus, when the voltage at the collector exceeds the reference value, the gate of the IGBT may be turned on to release a certain amount of electrical energy to form appropriate slow turn-off. For example, as shown in FIG. 5b, when the voltage at the collector exceeds a voltage of the TVS diode, current flows through the TVS diode, is amplified by the triode and is then applied to the gate of the IGBT, the IGBT is turned on to release the electrical energy, and then the voltage of the IGBT decreases. When the voltage at the collector decreases to be below a voltage drop of the TVS diode, the gate is turned off. In this way, adaptive slow turn-off is formed to achieve overvoltage protection.

As a backup, an additional overvoltage protection branch may also be provided. The overvoltage protection branch may output a signal which causes the IGBT to be turned on to the gate of the IGBT when the signal output by the collector voltage detection circuit indicates that the voltage at the collector exceeds the reference value. As shown in FIG. 5b, when the collector voltage detection circuit 501 indicates that the voltage at the collector is too high using a high level signal, the additional overvoltage protection branch may simply connect the output node of the collector voltage detection circuit 501 to the gate of the IGBT (e.g., via a resistor).

In another embodiment, because the MARX discharge loop is employed, various IGBT modules are floated differently at different high voltages, and both triggering and power supply for the triggering need to be isolated. For example, the triggering may be transmitted through an optical fiber, and the power supply for the triggering may be realized using a method for coupling high-frequency current with a current transformer, may be transmitted through a high-voltage-resistant wire, wherein a primary transformer may be implemented using a 1-turn transformer.

Figure 6:
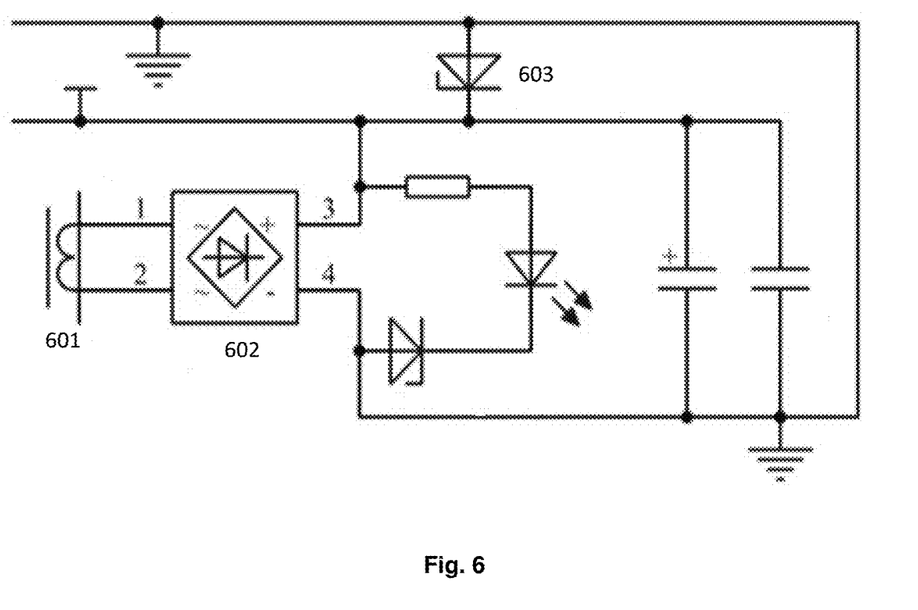
FIG. 6 illustrates a schematic circuit diagram of a power supply circuit for an IGBT in a solid state pulse modulator based on the MARX generator principle according to an embodiment of the disclosed technology.

FIG. 6 illustrates a schematic circuit diagram of a power supply circuit for an IGBT in a solid state pulse modulator based on MARX generator principle according to an embodiment of the disclosed technology.

As shown in FIG. 6, the power supply circuit according to this embodiment may comprise a mutual inductance coil 601, a conductive wire, a bridge rectifier 602, and a voltage regulation diode 603. The conductive wire is coupled to the mutual inductance coil and passes through the mutual inductance coil for transmitting alternating current and thus generating an alternating current signal in the mutual inductance coil. The bridge rectifier 602 converts the alternating current signal into a direct current signal to power a driving circuit. A positive output terminal 3 of the bridge rectifier 602 provides a power supply voltage and a negative output terminal 4 of the bridge rectifier 602 is connected to the ground for a gate of the IGBT. The voltage regulation diode 603 is connected between the positive output terminal and the negative output terminal of the rectifier.

In another embodiment, the disclosed technology further provides a solid state pulse modulator based on the MARX generator principle, comprising one or more of the gate protection circuit, the oscillation compensation circuit, the overcurrent protection circuit, the overvoltage protection circuit, and the power supply circuit as described above.

In the solid state pulse modulator based on the MARX generator principle, the disclosed technology can ensure the safety and reliability of the IGBT.

The above described methods, apparatus, units and/or modules in accordance with various embodiments of the disclosed technology may be implemented by execution of software comprising computer instructions by a computational electronic device. The system may comprise storage devices to implement the various storages described above. The computational electronic device may comprise a general purpose processor, a digital signal processor, a dedicated processor, a reconfigurable processor, etc., which can execute computer instructions, but is not limited thereto. Execution of such instructions causes the electronic device to be configured to perform the operations described above in accordance with the disclosed technology. Each of the above devices and/or modules may be implemented in one electronic device or in different electronic devices. The software can be stored in a computer readable storage medium. The computer readable storage medium stores one or more programs (software modules), the one or more programs including instructions that, when executed by one or more processors in an electronic device, cause the electronic device to execute methods of the disclosed technology.

The software may be stored in the form of volatile memory or non-volatile storage (e.g., a storage device like a ROM), whether erasable or rewritable, or stored in the form of a memory (e.g., RAM, memory chip, device or integrated circuit) is either stored on an optically readable medium or a magnetically readable medium (e.g., CD, DVD, magnetic disk or magnetic tape, etc.). It should be appreciated that the storage device and the storage medium are embodiments of a machine-readable storage device adapted to store one or more programs, the one or more programs comprising instructions that, when executed, implement an embodiment of the disclosed technology. The embodiment provides a program and a machine readable storage device storing such a program, the program comprising code for implementing the apparatus or method of any of the claims of the disclosed technology. Moreover, these programs can be transferred via any medium, such as a communication signal carried via a wired connection or a wireless connection, and various embodiments suitably include such programs.

Methods, apparatus, units, and/or modules in accordance with various embodiments of the disclosed technology may be implemented by, for example, a field programmable gate array (FPGA), a programmable logic array (PLA), a system on a chip, a system on a substrate, a system on a package, an application specific integrated circuit (ASIC), or in hardware or firmware, such as in any other reasonable manner for integrating or encapsulating the circuit, or in a suitable combination of three implementations of software, hardware, and firmware. The system may comprise a storage device to implement the storage described above. When implemented in these manners, the software, hardware, and/or firmware used is programmed or designed to perform the respective methods, steps and/or functions described above in accordance with the disclosed technology. One skilled in the art can appropriately implement one or more of these systems and modules, or a part of some parts of them, using different implementations described above, according to actual needs. These implementations fall within the scope of protection of the disclosed technology.

While the disclosed technology has been shown and described with respect to the specific embodiments of the embodiments of the disclosed technology, it may be understood by those skilled in the art that various changes in form and detail are made to the disclosed technology without departing from the spirit and scope of the disclosure as defined by the appended claims and their equivalents. Therefore, the scope of the invention should not be limited to the above-described embodiments, but should be determined not only by the appended claims but also by the equivalents of the appended claims.

What is claimed is:

1. A solid state pulse modulator based on the Marx generator principle, comprising a gate protection circuit for an Insulated Gate Bipolar Transistor (IGBT), the IGBT being used as a switch device in a solid state pulse modulator based on the Marx generator principle, the gate protection circuit comprising:
a voltage regulator configured to supply a stable voltage to an emitter of the IGBT with respect to ground for a gate of the IGBT;
wherein the voltage regulator is a voltage regulation diode having a cathode connected to the emitter of the IGBT and an anode connected to the ground for the gate of the IGBT.

2. The solid state pulse modulator according to claim 1, further comprising:
a resistor connected between the gate and the emitter of the IGBT.

3. The solid state pulse modulator according to claim 1, further comprising:
a bidirectional transient voltage suppression (TVS) diode connected between the gate and the emitter of the IGBT.

4. The solid state pulse modulator according to claim 3, wherein a stable voltage of 15V is provided across the TVS diode.

5. The solid state pulse modulator according to claim 1, further comprising an oscillation compensation circuit for the IGBT, the oscillation compensation circuit comprising:
an oscillation suppression resistor RG, wherein a driving signal of the IGBT is input to a gate of the IGBT via the oscillation suppression resistor; and
an oscillation suppression capacitor CG connected between the gate and an emitter of the IGBT.

6. The solid state pulse modulator according to claim 5, wherein the oscillation suppression resistor RG and the oscillation suppression capacitor CG satisfy the following formula:

$$R_G = 2\sqrt{\frac{L_G}{C_G}}$$

where $L_G$ is distributed inductance in a driving circuit of the IGBT.

7. The solid state pulse modulator according to claim 1, further comprising an overcurrent protection circuit for the IGBT, the overcurrent protection circuit comprising:
a collector voltage detection circuit configured to detect a voltage at a collector of the IGBT during a turn-on phase of the IGBT, and output a signal indicating whether the voltage at the collector exceeds a reference value; and
an overcurrent trigger circuit configured to output an overcurrent trigger signal to the driving circuit of the IGBT when the signal output by the collector voltage detection circuit indicates that the voltage at the collector exceeds the reference value, such that the driving circuit outputs, to the gate of the IGBT, a driving signal which causes the IGBT to be turned off.

8. The solid state pulse modulator according to claim 7, wherein the overcurrent trigger signal is input to the driving circuit through an AND gate together with a gate control trigger signal of the IGBT, and
wherein based on the signal output by the collector voltage detection circuit indicating that the voltage at the collector exceeds the reference value, the overcurrent trigger circuit outputs the overcurrent trigger signal at a low level.

9. The solid state pulse modulator according to claim 8, wherein the overcurrent trigger circuit comprises a transistor having a first terminal connected to an input terminal of the AND gate, and a second terminal connected to a low level, and
wherein, in response to the signal output by the collector voltage detection circuit indicating that the voltage at the collector exceeds the reference value, the transistor is turned on to turn on a connection between the first terminal and the second terminal.

10. The solid state pulse modulator according to claim 7, wherein the collector voltage detection circuit is configured to detect the voltage at the collector for a predetermined time after a time at which the IGBT starts to be turned on.

11. The solid state pulse modulator according to claim 10, wherein the collector voltage detection circuit comprises:
a constant current source configured to start up in response to the driving signal in the driving circuit which causes the IGBT to be turned on, to generate constant detection current; and
a delay mechanism configured to cause the constant detection current generated by the constant current source to be supplied to the collector of the IGBT based on a predetermined time elapsing after the constant current source starts up.

12. The solid state pulse modulator according to claim 11, wherein the delay mechanism comprises a capacitor,
wherein an output terminal of the constant current source is connected to a first terminal of the capacitor and to the collector of the IGBT via a detection resistor, wherein a second terminal of the capacitor is connected to a ground potential, and
wherein there is a unidirectional conduction device between the constant current source and the collector, such that the capacitor is charged by the current from the constant current source.

13. The solid state pulse modulator according to claim 12, wherein the collector voltage detection circuit further comprises: a different voltage regulation diode and a resistor connected between the first terminal of the capacitor and the ground potential, and wherein a connection node between the different voltage regulation diode and the resistor is used as an output node of the collector voltage detection circuit.

14. The solid state pulse modulator according to claim 1, further comprising an overvoltage protection circuit for the IGBT, the overvoltage protection circuit comprising:

a collector voltage detection circuit configured to detect a voltage at a collector of the IGBT during a turn-off phase of the IGBT, and output a signal indicating whether the voltage at the collector exceeds a reference value; and an overvoltage trigger circuit configured to output an overvoltage trigger signal to a driving circuit of the IGBT when the signal output by the collector voltage detection circuit indicates that the voltage at the collector exceeds the reference value, such that the driving circuit outputs, to a gate of the IGBT, a driving signal which causes the IGBT to be turned on.

15. The solid state pulse modulator according to claim 14, wherein the collector voltage detection circuit comprises one or more transient voltage suppression TVS diodes connected in series.

16. The solid state pulse modulator according to claim 14, wherein an output terminal of the overvoltage trigger circuit is connected to a control terminal of a high side transistor of a driving current amplifier circuit in push-pull configuration in the driving circuit of the IGBT.

17. The solid state pulse modulator according to claim 14, further comprising an additional overvoltage protection branch configured to output to the gate of the IGBT a signal for causing the IGBT to be turned on based on the signal output by the collector voltage detection circuit indicating that the voltage at the collector exceeds the reference value.

18. The solid state pulse modulator according to claim 1, further comprising a power supply circuit for a driving circuit of the IGBT, comprising:

a mutual inductance coil;

a conductive wire coupled to the mutual inductance coil, and configured to transmit alternating current and thus generate an alternating current signal in the mutual inductance coil;

a rectifier configured to convert the alternating current signal into a direct current signal to supply power to the driving circuit, wherein a positive output terminal of the rectifier provides a power supply voltage, and a negative output terminal of the rectifier is connected to a ground for a gate of the IGBT; and a different voltage regulation diode connected between the positive output terminal and the negative output terminal of the rectifier.

19. The solid state pulse modulator according to claim 18, wherein the conductive wire passes through the mutual inductance coil.

* * * * *